United States Patent
Beilstein, Jr. et al.

[11] Patent Number: 5,920,101
[45] Date of Patent: *Jul. 6, 1999

[54] STRUCTURE FOR MAKING SUB-LITHOGRAPHIC IMAGES BY THE INTERSECTION OF TWO SPACERS

[75] Inventors: Kenneth E. Beilstein, Jr.; Claude L. Bertin; James M. Leas, all of Chittenden County, Vt.; Jack A. Mandelman, Dutchess County, N.Y.

[73] Assignee: International Business Machines Corporation, Armonk, N.Y.

[ * ] Notice: This patent is subject to a terminal disclaimer.

[21] Appl. No.: 09/144,806

[22] Filed: Sep. 1, 1998

Related U.S. Application Data

[60] Continuation of application No. 08/864,836, May 29, 1997, Pat. No. 5,834,818, which is a division of application No. 08/539,244, Oct. 4, 1995, Pat. No. 5,714,039.

[51] Int. Cl.⁶ .................................................. H01L 29/76
[52] U.S. Cl. ......................... 257/390; 438/303; 438/595; 438/596
[58] Field of Search ............................ 257/390; 438/303, 438/595, 596, 265, 304

[56] References Cited

U.S. PATENT DOCUMENTS

| | | |
|---|---|---|
| 4,209,349 | 6/1980 | Ho et al. . |
| 4,256,514 | 3/1981 | Pogge . |
| 4,326,332 | 4/1982 | Kenney . |
| 4,878,996 | 11/1989 | Mitchell et al. . |
| 5,013,680 | 5/1991 | Lowrey et al. . |
| 5,055,898 | 10/1991 | Beilstein et al. . |
| 5,120,675 | 6/1992 | Pollack . |
| 5,352,927 | 10/1994 | Cote et al. . |
| 5,356,834 | 10/1994 | Sugimoto et al. . |
| 5,705,414 | 1/1998 | Lustig . |

OTHER PUBLICATIONS

Miller, "High Denisty, Planar Metal Lands", IBM Techincal Disclosure Bulletin, V23 N6, Nov. 1980, pp. 2270–2276.

Trump, "Process for Structuring a Submicron Mask", IBM Technical Disclosure Bulletin, V27 N5, Oct. 1984, pp. 3090–3091.

Barson et al., "High Density Planar Metal Lands", IBM Technical Disclosure Bulletin, V24 N2, Jul. 1981, pp. 1296–1299.

*Primary Examiner*—David B. Hardy
*Attorney, Agent, or Firm*—Whitham, Curtis & Whitham; Howard J. Walter, Jr.

[57] ABSTRACT

A method of forming a sub-lithographic image formed by the intersection of two spacers. A substrate with a first pattern of selectively etchable material with sidewalls that are substantially vertical is provided. A first sidewall spacer is formed of a material that is selectively etchable relative to the first pattern material. A second pattern of a selectively etchable material is formed with the second pattern intersecting the first pattern. The sidewalls of the second pattern are substantially vertical as well. A second sidewall spacer is formed of a material that is selectively etchable relative to the second pattern material. The second pattern material is etched to leave the second sidewall spacer. Alternatively, the first and/or second pattern materials may be totally removed, left in place, or planarized

10 Claims, 2 Drawing Sheets

STRUCTURE FOR MAKING SUB-LITHOGRAPHIC IMAGES BY THE INTERSECTION OF TWO SPACERS

CROSS-REFERENCE TO RELATED APPLICATION

This application is a continuation application of application Ser. No. 08/864,836 filed May 29, 1997, now U.S. Pat. No. 5,834,818 which in turn was a divisional application of application Ser. No. 08/539,244 filed Oct. 4, 1995, now U.S. Pat. No. 5,714,039.

BACKGROUND OF THE INVENTION

1. Field of the Invention

The present invention generally relates to a method of making sub-lithographic elements, and, more particularly, to a method of achieving a minimum size image formed by the intersection of two spacers.

2. Description of the Related Art

One of the challenges to achieving higher levels of integration in semiconductor manufacturing is the patterning of smaller and smaller images. If the smallest images on a die are lithographically determined, the number of devices or circuits that can be placed in a given area is roughly inversely proportional to the square of the minimum lithographic dimension.

Since the fabrication cost of a region of silicon is not strongly related to the size of the minimum geometry in that region, it is prudent to package as many circuits in a given area as possible while maintaining a reasonable manufacturing yield to minimize circuit cost.

Some have developed procedures to produce sub-lithographic images, thereby allowing more dense integration with a concomitant reduction in per circuit costs. For example, U.S. Pat. No. 4,256,514, describes a method for forming sidewall spacers for fabricating sub-lithographic images consisting of narrow lines.

While useful for many applications, such sidewall image transfer (SIT) procedures typically produce an image that is sub-lithographic along one dimension only, usually the width of the image. Such one dimensional sub-lithographic procedures, however, are ineffective for applications that seek smaller contact regions, which require small, sub-lithographic geometries in two dimensions.

In light of the foregoing, there exists a need for a method to achieve images that have sub-lithographic dimensions along two axes.

SUMMARY OF THE INVENTION

The present invention is directed to method of forming sub-lithographic images formed by the intersection of two spacers, which substantially obviates one or more of the problems due to the limitations and disadvantages of the related art.

The present method may be employed for any structure that uses an array of contacts, posts, holes, or bumps where density or image size are important. Possible applications include dynamic and static random access memory (DRAM/SRAM) arrays, other integrated circuit arrays, or liquid crystal displays.

In addition, the present method may be employed for any structure that requires sub-optical patterns for optical and sub-optical interactions. Typical applications would include diffraction gratings, structures to generate moire patterns, and optical and sub-optical filters for optical processing.

In general, a first spacer having a first width is formed along a first pattern material. Over the first pattern and first spacer there is formed a second pattern material with a second sidewall spacer having a second width, the second pattern material intersecting the first pattern material at an angle that is typically 90 degrees. The first spacer may then be etched everywhere except where it is masked by the second spacer. The resulting structure is sub-lithographically dimensioned along two axes.

To achieve these and other advantages and in accordance with the purpose of the invention, as embodied and broadly described, the invention provides for a method of forming a sub-lithographic image on a substrate comprising the steps of: (1) providing a first pattern of selectively etchable material on the substrate, the first pattern material having sidewalls that are substantially vertical; (2) forming a first sidewall spacer on the substantially vertical sidewalls of the first pattern material, the first sidewall spacer being of a material that is selectively etchable relative to the first pattern material; (3) forming a second pattern of a selectively etchable material having sidewalls that are substantially vertical, wherein the second pattern must intersect the first pattern; (4) forming a second sidewall spacer on the substantially vertical sidewalls of the second pattern material, the second sidewall spacer being of a material that is selectively etchable relative to the second pattern material; and (5) etching the second pattern material to leave the remaining second sidewall spacer.

In another aspect, additional method steps would include planarizing the surface after forming the first sidewall spacer, wherein the planarizing material can be etched selective to the first sidewall spacer.

In still other aspects, depending on the particular way in which the sub-lithographic structure will be used in the overall device, the first and/or second pattern materials may be totally removed, left in place, or planarized.

In still another aspect, the invention provides for a semiconductor device structure for forming a sub-lithographic image on a substrate, comprising a first pattern of selectively etchable material on the substrate, the first pattern material having sidewalls that are substantially vertical; a first sidewall spacer formed outwardly of the substantially vertical sidewalls of the first pattern material, the first sidewall spacer being of a material that is selectively etchable relative to the first pattern material; a second pattern of a selectively etchable material having sidewalls that are substantially vertical, wherein the second pattern intersects the first pattern; and a second sidewall spacer formed outwardly of the substantially vertical sidewalls of the second pattern material, the second sidewall spacer being of a material that is selectively etchable relative to the second pattern material.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

It would be understood by those skilled in the art that the method of the present invention—forming sub-lithographic images determined by the intersection of two spacers—may be used in a wide variety of integrated circuit applications. For discussion and illustrative purposes, the method of the present invention is described with respect to a Dynamic Random Access Memory (DRAM) cell, as described, for example, in U.S. Pat. No. 5,055,898. The discussion of the DRAM cell is not meant to limit the breadth of the present inventive method, but is merely provided to show one application of the inventive process.

Accordingly, it is understood that various conventional deposition, masking, etching, and process techniques may be used to form a particular semiconductor device, and still be within the scope and practice of the present invention.

As stated above, the present method may be employed for any structure that uses an array of contacts, holes, bumps, or posts where density or image size are important.

Figure 1:
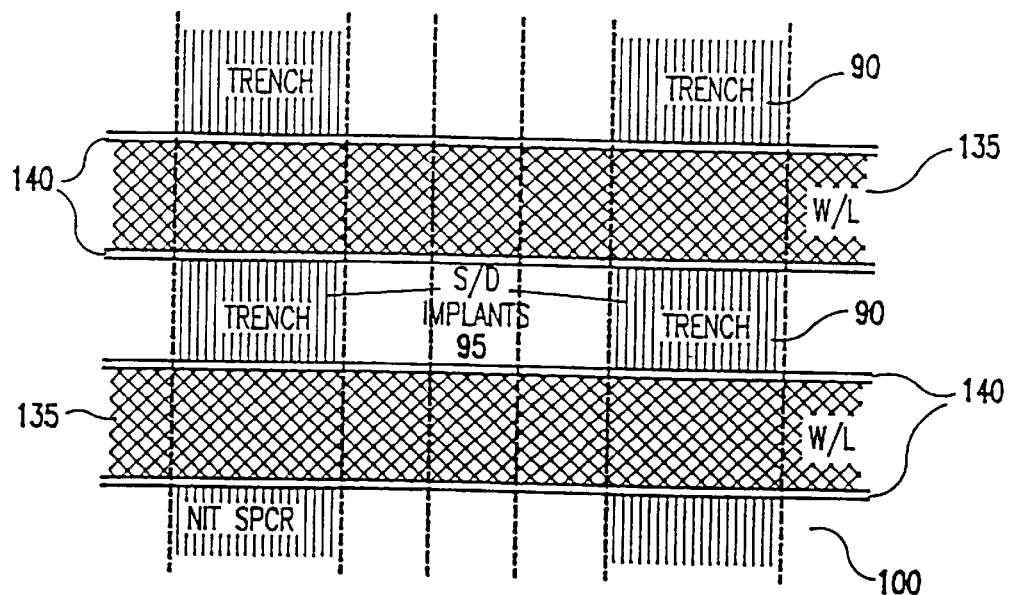
FIG. 1 is a top view of a device usable with the method of the present invention.

Referring now to the drawings, and more particularly to FIG. 1, there is shown an exemplary top view of a DRAM device. Using suitable masking techniques and anisotropic reactive ion etching (RIE), trenches 90 are etched into a silicon substrate 100 to a desired length, depth, and width, depending on the desired performance characteristics of the resulting device. A dielectric such as oxide-nitride-oxide is deposited, approximately 10 nanometers thick. These trenches 90 are then filled with a gate polysilicon to form the storage capacitor.

A first pattern material, forming conventional wordlines (W/L) for example, is provided consisting of polysilicon 135 (or other gate conductor). A layer of nitride is then deposited and directionally etched to form nitride spacers 140 along each of the wordline 135 edges.

A suitable dopant (e.g., boron or phosphorous depending on the type of device) may then be ion implanted to form the source and drain regions 95, self-aligned to the nitride spacers 140 on the wordline edge. The dopant is activated using standard annealing techniques to diffuse the dopant under the nitride spacer 140 and gate edge.

Figure 2:
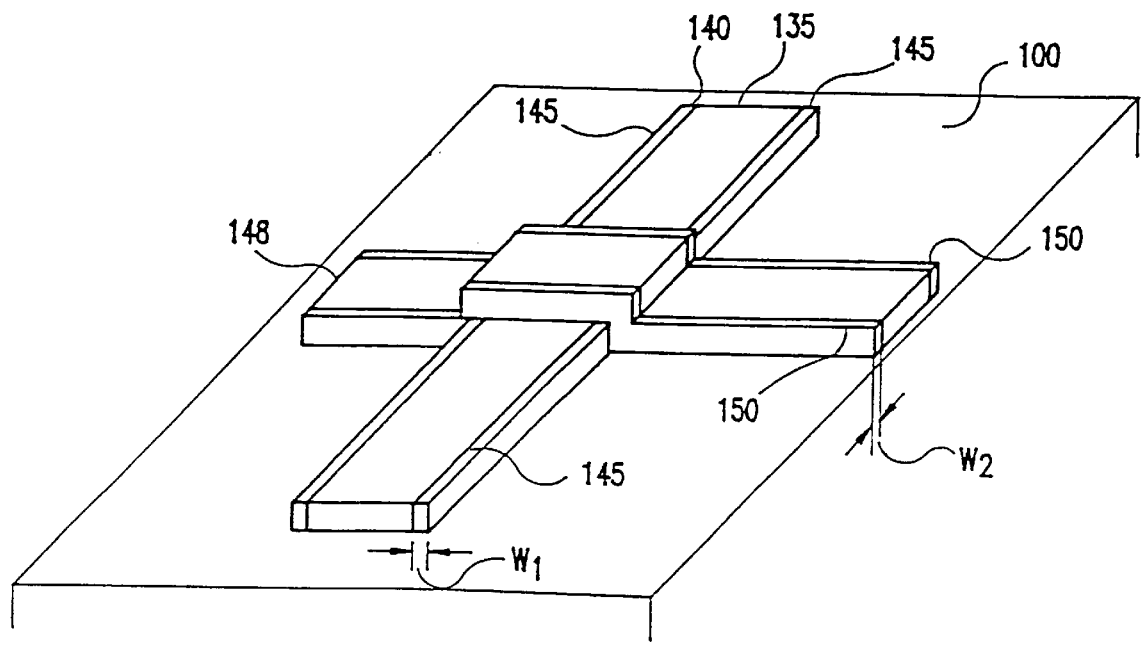
FIG. 2 is a simplified perspective view of the device of FIG. 1 showing the intersection of first and second pattern materials.

FIG. 2 is a simplified perspective view of the device of FIG. 1 with the first pattern material or wordline 135 shown formed on the substrate 100. As shown in FIG. 2, a sacrificial spacer 145 is formed outwardly of the nitride spacers 140 (for clarity, the thickness of the nitride spacers 140 on the wordline edges are not shown in FIG. 2). Note for now that the width '$w_1$' of the spacer 145 corresponds to the x-dimension in FIG. 3.

The sacrificial spacers 145 may be composed of BN (boron nitride), $Al_2O_3$ (aluminum trioxide), or other suitable material. What is important is that the sacrificial spacers 145 have different etch properties than silicon, oxide, and nitride since a portion of this sacrificial spacer 145 may later be removed selective to the silicon, oxide, and nitride materials that make up the device.

A second pattern material 148, sacrificial polysilicon for example, is then deposited over the device. A resist is applied and a mask is aligned so that a reactive, ion etch (RIE) of the sacrificial polysilicon forms stripes 148 (only one of which is illustrated for clarity) perpendicular to the wordline 135. Although a perpendicular intersection may be preferred for most applications, the intersection of the wordline 135 and sacrificial polysilicon stripe 148 need not be perpendicular, and may be at any angle other than parallel.

Next, a layer of TEOS (tetraethylorthosilicate) or other suitable material is deposited and spacer etched to form TEOS spacers 150 on the edges of the sacrificial polysilicon stripe 148. The sacrificial polysilicon stripe 148 may then be RIE etched, leaving the TEOS spacers 150. Note that the width '$w_2$' of the spacer 150 corresponds to the y-dimension in FIG. 3.

Figure 3:
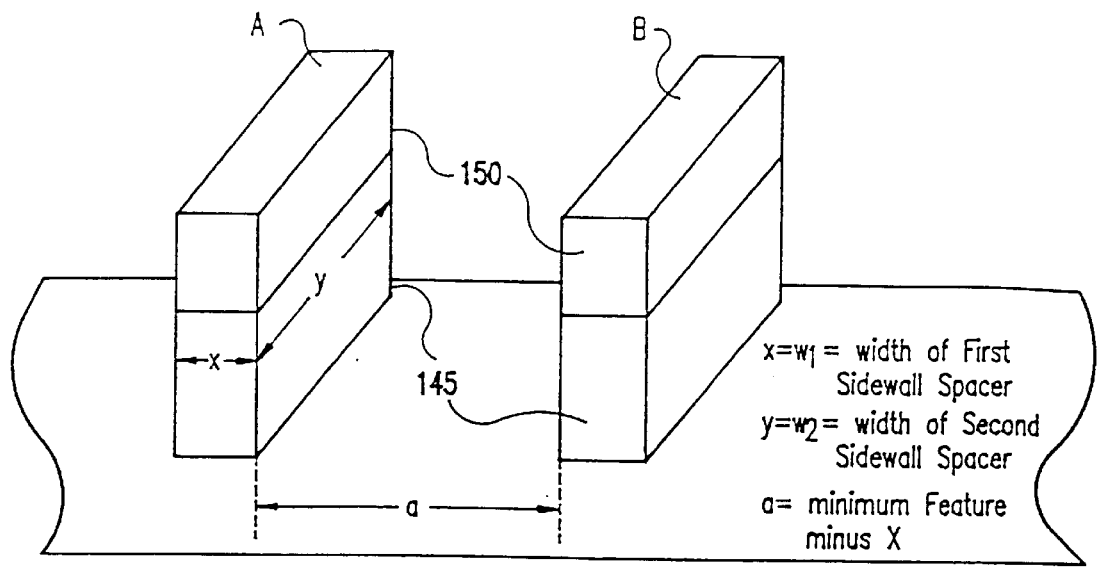
FIG. 3 is a perspective view showing the contacts formed by the intersection of the two spacers.

The BN (or $Al_2O_3$) spacers 145 on the edges of the wordline 135 are then RIE etched except where protected by the TEOS oxide spacers 150 to produce a sub-lithographic structure as shown in FIG. 3. FIG. 3 has been simplified (by removal of any pattern materials) and the x- and y-dimensions have been exaggerated to highlight that regions A and B are composed of spacers 145 and 150. Note that the TEOS layer 150 is actually a stripe passing over spacers 145.

Referring to FIG. 2, if the region outside of wordline 135 and spacers 140, 145 is not filled and planarized, subsequent deposition and formation of the TEOS spacers 150 will also form spacers on the BN spacers 145. This should not effect the end result, since suitable mask and etch steps could be utilized to achieve the desired spacer locations. If the region outside of wordline 135 and spacers 140, 145 is filled and planarized, then no spacers will be formed along existing spacer 145.

Figure 4:
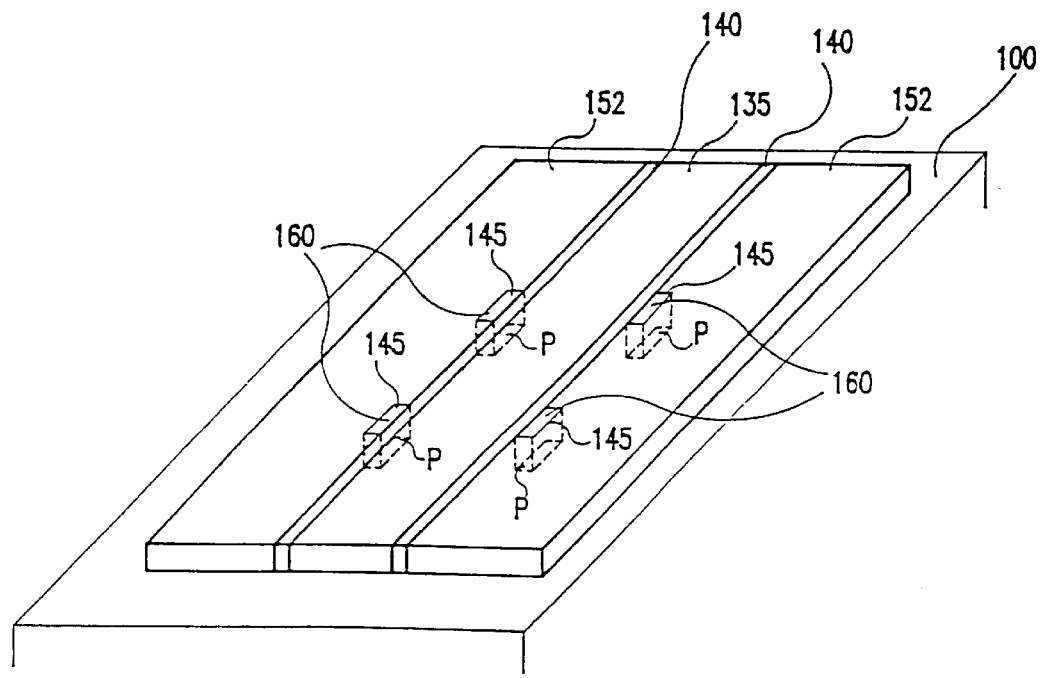
FIG. 4 is a simplified perspective view of the device of FIG. 2 showing the strap openings or posts formed by the method of the present invention.

In one process as shown in FIG. 4, the spaces between the wordlines, formed by the RIE etch of the polysilicon stripes 148, are filled with TEOS 152 and planarized, to the tops of the remaining BN spacers 145, thereby effectively removing the spacer material 150 from regions A and B. The remaining BN spacers may then be directionally etched to form strap openings 160. In the case of a DRAM cell, these resulting strap openings 160 will become the bitline and node contacts to the transistor using conventional DRAM completion processing techniques. The original nitride sidewall spacer 140 prevents the strap openings from shorting to the wordline 135 when the strap openings are filled with a conductor.

As shown in FIGS. 3 and 4, and in accordance with the method of the present invention, the BN spacers 145—that are later RIE etched out to form strap openings 160—have both their length and width determined by the intersection of two spacers 145 and 150. In other words, the strap openings 160 are spacer-sized in both dimensions ('x' and 'y') as a result of the interconnection of the first BN spacer 145 and the second TEOS spacer 150. By altering the widths $w_1$ and $w_2$ of the respective spacers 145 (BN spacers) and 150 (TEOS spacers), the 'x' and 'y' dimensions of the contact or strap openings may be infinitely adjusted to achieve the desired feature size.

Note that the first and second pattern materials are selectively etchable, and that the first and second sidewall spacers are selectively etchable relative to the respective first and second patterns. Accordingly, depending on the particular application for the two-dimensional sub-lithographic structure, each of the four materials (i.e., first 135 and second 148 pattern materials, and first 145 and second 150 spacers) may be etched away or left in place to produce the desired two-dimensional sub-lithographic structure.

By way of example and not by limitation, let us assume that the first spacer material is made from a metallic material such as tungsten that can be conformally deposited. In accordance with the method of the present invention, a second pattern material and second spacer material would then be formed over the tungsten, followed by removal of the second pattern material, thereby leaving the second spacer material. The tungsten may then be etched-using the second spacer material as a mask, and thereafter-removing the second spacer material. Referring to FIG. 4, by depositing and then planarizing the TEOS 152, the strap openings 145 become tungsten contacts that were constructed directly from the first spacer material. This eliminates the need to fill the strap openings with conductive metal after etching out the first spacers (BN or aluminum oxide). In either case, with the tungsten spacer or the BN spacer, the contact is self-aligned to the wordline or whatever structure that was used to construct the spacer.

In still another alternative, if layer 152 was not deposited and layer 135 and its original nitride spacer 140 are removed, then one could construct tungsten metal posts P, as shown by the dashed lines in FIG. 4.

Alternatively, the first pattern material and first sidewall spacer may be planarized before forming the second pattern material. Likewise, a planarizing step may follow the formation of the second pattern material and second sidewall spacer.

While the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A semiconductor device structure for forming a sub-lithographic image on a substrate, comprising:

a first structure of a selectively etchable first material, arranged along a first pattern line parallel to a major surface of the substrate, said first structure having sidewalls that are substantially vertical with respect to the major surface;

a first sidewall spacer formed outwardly of the substantially vertical sidewalls of said first structure, said first sidewall spacer being of a second material that is selectively etchable relative to said first material;

a second structure of a selectively etchable third material, arranged along a second pattern line parallel to the major surface of the substrate, having sidewalls that are substantially vertical with respect to the major surface of the substrate, wherein the second pattern line intersects the first pattern line; and a second sidewall spacer formed outwardly of said substantially vertical sidewalls of said second structure, said second sidewall spacer being of a fourth material that is selectively etchable relative to the third material.

2. A structure as in claim 1, wherein the first and second sidewall spacers define first and second widths.

3. A structure as in claim 2, wherein the first sidewall spacer defines a first dimension along a first axis, and the second sidewall spacer defines a second dimension along a second different axis.

4. A structure as in claim 1, wherein the intersection of the first and second pattern lines is substantially perpendicular.

5. A structure as in claim 1, wherein the second material is one of BN and $Al_2O_3$.

6. A structure having its length and width defined by the intersection of respective first and second sidewall spacers.

7. The structure as recited in claim 6 wherein said structure is on a substrate.

8. The structure as recited in claim 6 wherein said substrate comprises a semiconductor.

9. The structure as recited in claim 6 wherein said first sidewall spacer is formed of a first material and said second sidewall spacer is formed of a second material, said second material different from said first material.

10. The structure as recited in claim 6 wherein said first material comprises one of tungsten, BN, and $Al_2O_3$.

* * * * *